(12) United States Patent
Gray

(10) Patent No.: US 7,724,157 B1
(45) Date of Patent: May 25, 2010

(54) KEYBOARD

(76) Inventor: Keith I. Gray, 1969 Waverly St., Napa, CA (US) 94558

( * ) Notice: Subject to any disclaimer, the term of this patent is extended or adjusted under 35 U.S.C. 154(b) by 811 days.

(21) Appl. No.: 11/620,221

(22) Filed: Jan. 5, 2007

(51) Int. Cl.
H03M 11/00 (2006.01)

(52) U.S. Cl. .......................... 341/22; 341/26; 400/100; 400/485; 345/168; 702/145; 702/148

(58) Field of Classification Search .................. 341/20, 341/22, 26; 400/100, 485; 345/168; 702/145, 702/148
See application file for complete search history.

(56) References Cited

U.S. PATENT DOCUMENTS

| | | | |
|---|---|---|---|
| 4,067,431 A * | 1/1978 | Whitaker | 400/485 |
| 4,159,471 A | 6/1979 | Whitaker | |
| 4,467,321 A | 8/1984 | Volnak | |
| 4,516,939 A | 5/1985 | Crimmins, Jr. | |
| 4,679,030 A | 7/1987 | Volnak | |
| 4,791,408 A * | 12/1988 | Heusinkveld | 700/84 |
| 4,831,218 A | 5/1989 | Wright | |
| 4,905,001 A | 2/1990 | Penner | |
| 5,087,910 A * | 2/1992 | Guyot-Sionnest | 345/169 |
| 5,281,966 A * | 1/1994 | Walsh | 341/22 |
| 5,361,083 A * | 11/1994 | Pollack | 345/169 |
| 5,515,305 A * | 5/1996 | Register et al. | 708/145 |
| 5,642,108 A * | 6/1997 | Gopher et al. | 341/22 |
| D381,017 S | 7/1997 | Burrell, IV | |
| 5,828,323 A | 10/1998 | Bartet | |
| 5,993,089 A | 11/1999 | Burrell, IV | |

* cited by examiner

Primary Examiner—Albert K Wong
(74) Attorney, Agent, or Firm—Charles L. Thoeming

(57) ABSTRACT

An improved keyboard system and apparatus using keys spaced and sized to correspond to human hands provides rapid data entry applicable to all electronic devices. Each key combination provides a binary sequence, and each sequence is associated with an alphabetic, numeric or control character using standard ASCII coding. The preferred eight key embodiment is adapted to the back of a hand-held electronic device whereby data is readily input by a user holding the device with both hands.

16 Claims, 5 Drawing Sheets

| Numeric Code | | | | | | | | | | | | | | | |
|---|---|---|---|---|---|---|---|---|---|---|---|---|---|---|---|
| 0 0 0 | 0 0 1 | 0 0 2 | 0 0 3 | 0 0 4 | 0 0 5 | 0 0 6 | 0 0 7 | 0 0 8 | 0 0 9 | 0 1 0 | 0 1 1 | 0 1 2 | 0 1 3 | 0 1 4 | 0 1 5 |

| Control, Numeric, Alphabetic Characters | | | | | | | | | | | | | | | |
|---|---|---|---|---|---|---|---|---|---|---|---|---|---|---|---|
| Nul | F1 | F2 | F3 | F4 | F5 | F6 | F7 | F8 | F9 | F10 | F11 | F12 | Esc | Tab | B'Spc |

Key Operation Diagram

| Numeric Code | | | | | | | | | | | | | | | |
|---|---|---|---|---|---|---|---|---|---|---|---|---|---|---|---|
| 0 1 6 | 0 1 7 | 0 1 8 | 0 1 9 | 0 2 0 | 0 2 1 | 0 2 2 | 0 2 3 | 0 2 4 | 0 2 5 | 0 2 6 | 0 2 7 | 0 2 8 | 0 2 9 | 0 3 0 | 0 3 1 |

| Control, Numeric, Alphabetic Characters | | | | | | | | | | | | | | | |
|---|---|---|---|---|---|---|---|---|---|---|---|---|---|---|---|
| Enter | Pg↑ | Pg↓ | ← | ↑ | ↓ | → | Home | End | Insert | | | | | | |

Key Operation Diagram

| Numeric Code | | | | | | | | | | | | | | | |
|---|---|---|---|---|---|---|---|---|---|---|---|---|---|---|---|
| 0 3 2 | 0 3 3 | 0 3 4 | 0 3 5 | 0 3 6 | 0 3 7 | 0 3 8 | 0 3 9 | 0 4 0 | 0 4 1 | 0 4 2 | 0 4 3 | 0 4 4 | 0 4 5 | 0 4 6 | 0 4 7 |

| Control, Numeric, Alphabetic Characters | | | | | | | | | | | | | | | |
|---|---|---|---|---|---|---|---|---|---|---|---|---|---|---|---|
| Space | ! | " | # | $ | % | & | ' | ? | < | = | > | ; | : | , | . |

Key Operation Diagram

| Numeric Code | | | | | | | | | | | | | | | |
|---|---|---|---|---|---|---|---|---|---|---|---|---|---|---|---|
| 0 4 8 | 0 4 9 | 0 5 0 | 0 5 1 | 0 5 2 | 0 5 3 | 0 5 4 | 0 5 5 | 0 5 6 | 0 5 7 | 0 5 8 | 0 5 9 | 0 6 0 | 0 6 1 | 0 6 2 | 0 6 3 |

| Control, Numeric, Alphabetic Characters | | | | | | | | | | | | | | | |
|---|---|---|---|---|---|---|---|---|---|---|---|---|---|---|---|
| 0 | 1 | 2 | 3 | 4 | 5 | 6 | 7 | 8 | 9 | ( | ) | + | - | * | / |

Key Operation Diagram

FIG. 1

| Numeric Code | | | | | | | | | | | | | | | |
|---|---|---|---|---|---|---|---|---|---|---|---|---|---|---|---|
| 064 | 065 | 066 | 067 | 068 | 069 | 070 | 071 | 072 | 073 | 074 | 075 | 076 | 077 | 078 | 079 |

| Control, Numeric, Alphabetic Characters | | | | | | | | | | | | | | | |
|---|---|---|---|---|---|---|---|---|---|---|---|---|---|---|---|
| @ | A | B | C | D | E | F | G | H | I | J | K | L | M | N | O |

| Numeric Code | | | | | | | | | | | | | | | |
|---|---|---|---|---|---|---|---|---|---|---|---|---|---|---|---|
| 080 | 081 | 082 | 083 | 084 | 085 | 086 | 087 | 088 | 089 | 090 | 091 | 092 | 093 | 094 | 095 |

| Control, Numeric, Alphabetic Characters | | | | | | | | | | | | | | | |
|---|---|---|---|---|---|---|---|---|---|---|---|---|---|---|---|
| P | Q | R | S | T | U | V | W | X | Y | Z | [ | \ | ] | ^ | _ |

| Numeric Code | | | | | | | | | | | | | | | |
|---|---|---|---|---|---|---|---|---|---|---|---|---|---|---|---|
| 096 | 097 | 098 | 099 | 100 | 101 | 102 | 103 | 104 | 105 | 106 | 107 | 108 | 109 | 110 | 111 |

| Control, Numeric, Alphabetic Characters | | | | | | | | | | | | | | | |
|---|---|---|---|---|---|---|---|---|---|---|---|---|---|---|---|
| ` | a | b | c | d | e | f | g | h | i | j | k | l | m | n | o |

| Numeric Code | | | | | | | | | | | | | | | |
|---|---|---|---|---|---|---|---|---|---|---|---|---|---|---|---|
| 112 | 113 | 114 | 115 | 116 | 117 | 118 | 119 | 120 | 121 | 122 | 123 | 124 | 125 | 126 | 127 |

| Control, Numeric, Alphabetic Characters | | | | | | | | | | | | | | | |
|---|---|---|---|---|---|---|---|---|---|---|---|---|---|---|---|
| p | q | r | s | t | u | v | w | x | y | z | { | \| | } | ~ | Del |

FIG. 2

KEYBOARD

CROSS REFERENCES TO RELATED APPLICATIONS

None.

STATEMENT REGARDING FEDERALLY SPONSORED RESEARCH OR DEVELOPMENT

None.

THE NAMES OR PARTIES TO A JOINT RESEARCH AGREEMENT

None.

INCORPORATION-BY-REFERENCE OF MATERIAL SUBMITTED ON A COMPACT DISC

None.

TECHNICAL FIELD

This application relates to electronic input devices or data input systems. More specifically, the preferred embodiment input device apparatus comprises eight keys spatially arranged to allow a user to securely grip the device receiving input while operating all keys.

BACKGROUND OF THE INVENTION

Keyboard size and function for personal digital assistants (PDAs) and cell phones have evolved to keep up with the continued reduction in overall size of these devices. Presently, keyboards are provided on the front side of the device with varying combinations of keystroke and key identifiers to provide functional user data input. Two types of keyboards are currently in wide use; "querty" and "Dvorak" comprising multiple function keys. Traditional keyboard function on PDAs, cell phones, and other hand-held microprocessor devices have inherent disadvantages, including the following:

1. Small keys requiring use of a stylus or slow manual hunt and peck input keystrokes;
2. Multiple functions per key requiring multiple keystrokes on the same key; and
3. Lack of spacing between and among keys consistent with the size of the user's fingers.

The following U.S. patents disclose key boards believed to be representative of the current state of the prior art: U.S. Pat. No. 5,993,089, issued Nov. 30, 1999, U.S. Pat. No. 5,828,323, issued Oct. 27, 1998, U.S. Pat. No. 4,905,001, issued Feb. 27, 1990, U.S. Pat. No. 4,831,218, issued May 16, 1989, U.S. Pat. No. 4,679,030, issued Jul. 7, 1987, U.S. Pat. No. 4,516,939, issued May 14, 1985, U.S. Pat. No. 4,467,321, issued Aug. 21, 1984, U.S. Pat. No. 4,159,471, issued Jun. 26, 1979, and U.S. Pat. No. Des. 381,017, issued Jul. 15, 1997.

DISCLOSURE OF INVENTION

The present invention relates to an improved keyboard system and apparatus using keys spaced and sized to correspond to human hands. The system and apparatus provide rapid data entry applicable to all electronic devices. Each key combination provides a binary sequence, and each sequence is associated with an alphabetic, numeric or control character using standard ASCII coding. The preferred eight key embodiment is adapted to the back of a hand-held electronic device whereby data is readily input by a user holding the device with both hands.

It is an object to provide an improved data input device adaptable to any electronic device requiring data input.

It is a further object to provide a data input device capable of rapid input without undue operator physical stress.

It is yet another object to provide a data input device having a minimal footprint without reducing the natural size and operational spatial requirements of human hands, thus minimizing the likelihood of repetitive motion or carpel tunnel syndrome.

Another objective is to provide a data input device that can be integrated into the body of a hand-held electronic device.

While the prior art indicated above does not teach or suggest the combination of structural and useful features disclosed and claimed herein, it demonstrates the viability of the novel concept of improved data input devices; it also teaches the importance of minimizing space requirements for keyboard input apparatus, as well as eliminating the use of separate keys for single input function.

BRIEF DESCRIPTION OF DRAWINGS

FIG. 1 is a chart depicting a portion of control, numeric and alphabetic codes for each of 63 key stroke combinations for an embodiment using an eight key entry pad and having a total of 127 defined key strokes.

FIG. 2 is a chart depicting the balance of control, numeric and alphabetic codes for each of 64 key stroke combinations for an embodiment using an eight key entry pad and having a total of 127 defined key strokes partly depicted in FIG. 1.

MODES FOR CARRYING OUT THE INVENTION

Figure 3:
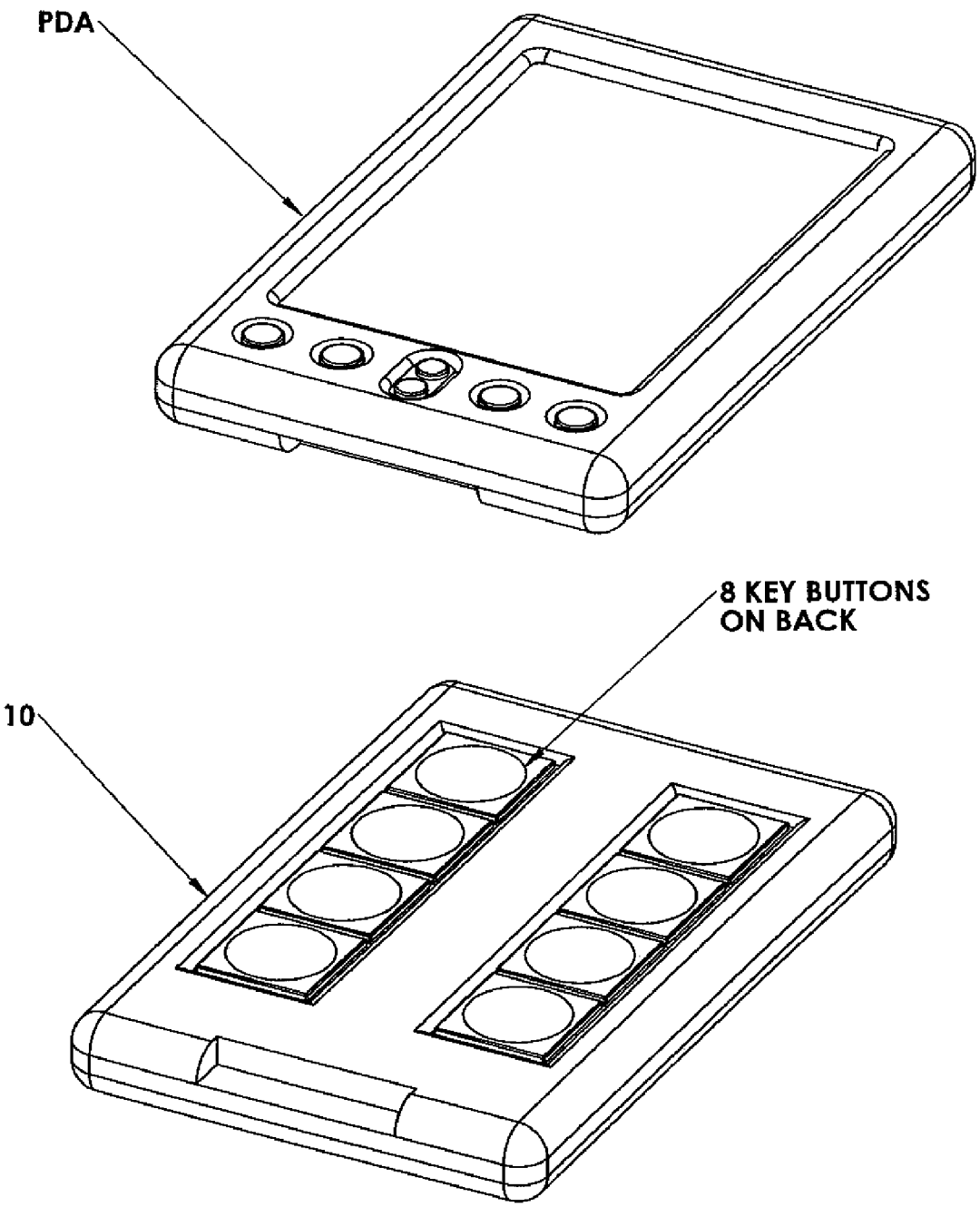
FIG. 3 depicts a device where eight key embodiment keyboard is integrated into the back of the device.
Figure 4:
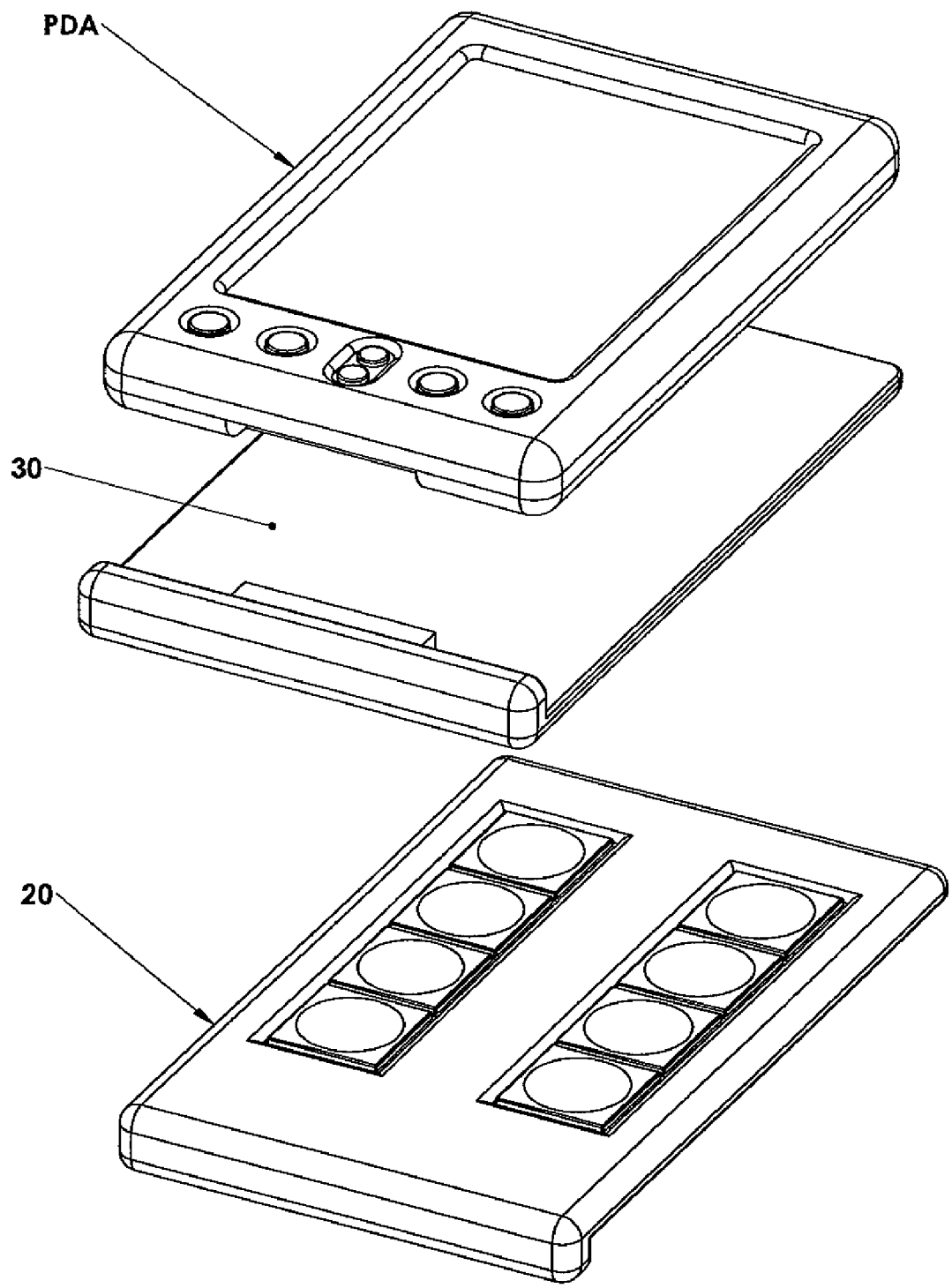
FIG. 4 depicts an embodiment having a detachable eight key keyboard that communicates with the device connecting port and the device rests on the attachment surface.

With reference to the drawing figures, a keyboard is set up with eight keys which are arranged so that four keys are situated and operated by the four fingers of the right hand and four keys in similar manner for the left hand, FIGS. 3 and 4. The keys are arranged and spaced such that the fingers naturally fit onto and operate them. For a device having eight keys for data input, 255 unique combinations are presented when the keys are pressed either individually or in combination.

An embodiment uses a specific code in which the fingers are designated with a numeric value as follows:

Right index 1;
Right middle 2;
Right ring 4;
Right little 8;
Left index 16;
Left middle 32;
Left ring 64; and
Left little 128.

Using the foregoing binary sequence, by pressing fingers individually or in combinations simultaneously any number up to 255 can be identified. Using standard ASCII coding each decimal value is assigned either an alphabetic, numeric, or control character. The right hand basically identifies the value and the left hand provides an indexing level. As an example, FIGS. 1 and 2 depict 127 values assigned for a modified ASCII code to logically enhance fingering sequence. Each of the circles under the decimal number and character represented indicate each of the fingers, four left hand fingers and four right hand fingers. If the circle is solid it represents that the key operated by that finger is depressed and the unfilled circle means it is not operated.

This is a specific code system for a preferred embodiment but any system could be employed to represent the various characters used as input to computer devices. By the use of the thumbs it is also possible to have ten keys, which would provide 1024 unique combinations.

The preferred embodiment is primarily considered as an improved input system for a personal digital assistant (PDA) device. PDA devices use data input in some form of written character recognition means, picking characters on the screen with a stylus or using a miniature keyboard. Full size keyboards are also used; some of which can be folded but these are much larger and are not as readily portable. The picking representation and the keyboards are normally based on the standard typewriter or computer keyboard configured as a "so called" (querty) form, or a variation thereof, or the Dvorak keyboard.

The keys for the eight key embodiment 10 described above are integrated on the back of the device, FIG. 3, such that each finger on the left hand is located on the left side to operate one button and each finger on the right hand is located on the right side, also to operate one button. The PDA is held with the fingers as described on the back with the thumbs on the front side and the buttons of the keyboard can then be operated by pressure between the finger or fingers and the thumbs.

FIG. 4 depicts an embodiment for an attachable eight key keyboard 20 that connects to the usual connecting port of the PDA and the PDA rests on a surface 30 of the attachment. In each case, FIGS. 3 and 4, the keys are located on the back to allow for operation as described herein.

With the described system of operation the fingers do not have to move to depress keys that they are not located on and simultaneous depression of the key combinations are used to provide input of all characters. In not having to locate and press a specific key or find a position on the screen to press with a stylus allows for faster input. The character recognition method also presents particular limitations since written representations need to be quite precise, which makes for slow input.

Another device, which can benefit from the disclosed embodiments, is the telephone and particularly cell phones. The disclosed system would provide for fast input of text.

In further considerations, the eight key keyboards can also be used to advantage in replacing the conventional style of keyboard. The size would be much smaller and could be configured to operate either with the keys on the back and using pressure between the thumbs and fingers or have it rest on a fixed surface where the fingers can depress the keys. By having alternate modes of holding the keyboard it has the potential to reduce carpel tunnel conditions. Also by not having to move the fingers to locate keys the typing speed of input can be increased. It is envisaged that the keyboard would be adjustable for the alternate methods of input. In a preferred embodiment for PDA and cell phone type application, the keys would be located on the back of the device and operation would be facilitated by using the pressure of the finger combinations in coordination with pressure of the thumbs on the front of the device as the device is held for input or other operation. As such, the compact feature of a keyboard fitting the design requirements of a small electronic device while having full sized input keys and rapid input characteristics is presented.

An obstacle to multiple keyed input results in attempting to press multiple keys simultaneously when not all keys operate at exactly the same time. Experimentation has shown that the range of simultaneity varies from about 10 to 50 milliseconds. The length of time that the keys are depressed varies from about 100 to 150 milliseconds. This gives a range of time between 50 and 100 milliseconds where if any of the switches associated with the keys are closed, they are considered to have operated simultaneously.

Figure 5:
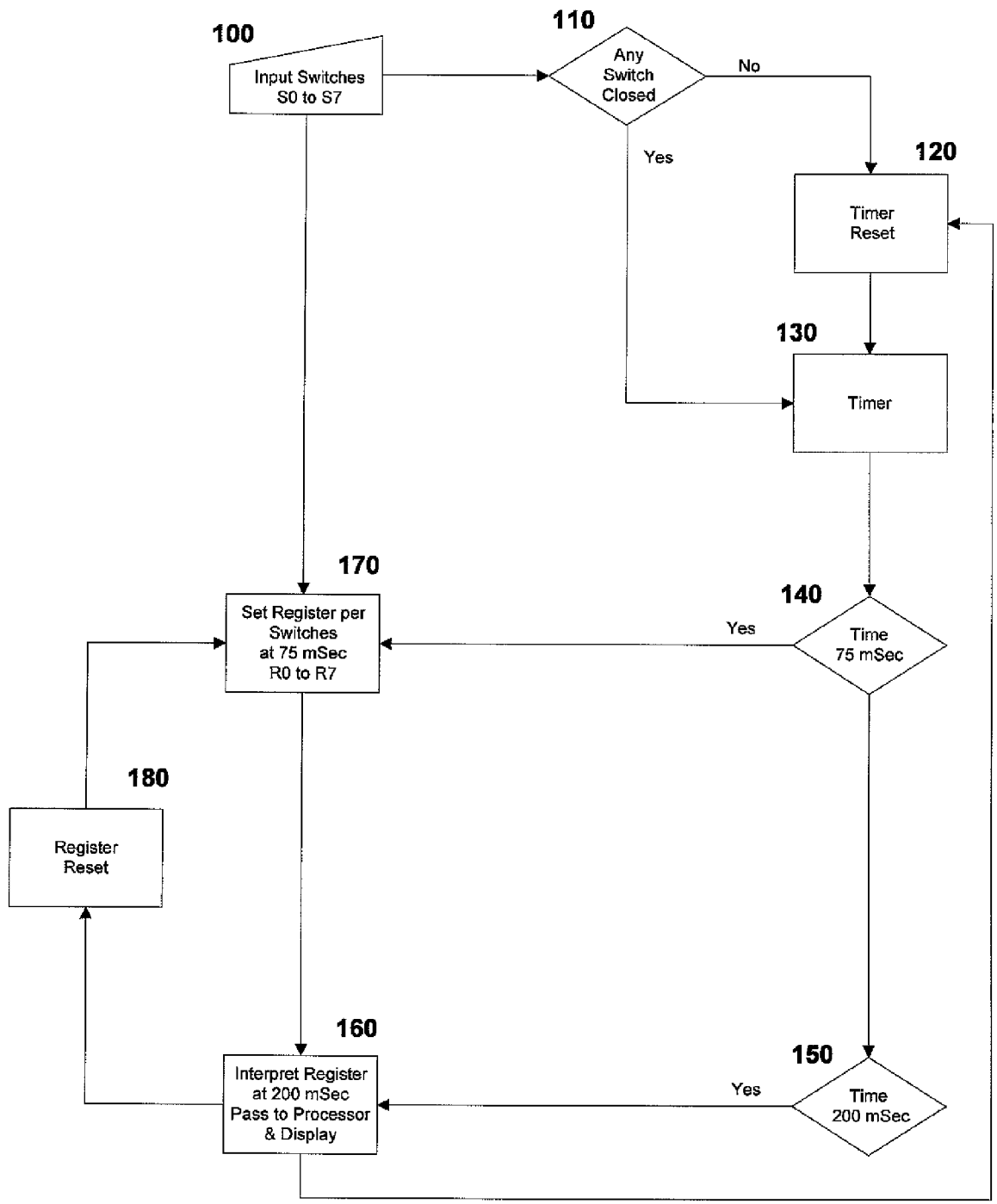
FIG. 5 depicts a logic flow diagram for the preferred embodiment.

The foregoing provides the basis of operating logic for the preferred embodiment, FIG. 5. For each of the 8 keys are 8 input switches 100 labeled S0 to S7. Each switch is associated with a register of a controller, which has 8 registers 170 labeled R0 to R7. If any of the switches 100 are closed 110 at a specific time each closed switch sets its respective associated register to a 1 state. If any of the switches are open at this time the associated registers will remain at a 0 state. The controller in the preferred embodiment is a microprocessor.

The default condition of the controller is a wait mode where it is monitoring the switches 100. When any of the switches 100 close the timer 130 is started through the decision branch 110. At a set time interval of 75 milliseconds 140, for each of the switches 100 that are closed the associated register 170 is set to a 1 state. At a second time interval of 200 milliseconds 150 the data in the register 170 is interpreted and passed to the processor and device display 160. Once the data is interpreted and passed to the display, reset commands are sent through the register reset 180 to the register 170 and through the timer reset 120 to the timer 130. If all of the switches 100 are all open after these reset commands, the timer 130 remains in the reset mode and nothing further happens until a switch closes. Upon one or more switches closing, the process is repeated.

If it is desired to repeat a character the appropriate switches will still be closed and decision branch 110 will start the timer 130. The process is continued until all switches open and the system returns to the wait mode.

It is possible that as the user becomes more practiced using this data input method and system the 75 millisecond time interval 140 can be shortened. Also, the time interval 150 of 200 milliseconds can be adjusted for faster or slower speed based upon operator capability.

The foregoing disclosure is sufficient to enable one having skill in the art to practice the invention without undue experimentation, and provides the best mode of practicing the improved keyboard system and apparatus presently contemplated by the inventor. While there is provided herein a full and complete disclosure of the preferred embodiments of keyboard data input systems and apparatus, it is not intended to limit the apparatus to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Accordingly, the proper scope of the data input system and apparatus should be determined only by the broadest interpretation of the appended claims so as to encompass all such modifications as well as all relationships equivalent to those illustrated in the drawings and described in the specification.

I claim:

1. A data entry system operated by a user with two hands, comprising:
    a plurality of value keys operated by one hand of the user;
    a plurality of level keys operated by the user's other hand;
    each of the keys capable of being depressed and released;
    each of the value keys generating a distinct value code upon depression;
    each of the indexing level keys generating a distinct indexing code upon depression;

wherein the sum of each of the value codes and each of the indexing codes is distinct from each such other sum and from each of the value codes and each of the indexing codes;

a controller in electrical communication with the keys;

wherein the controller generates output codes depending upon which value codes and indexing codes are generated by the depression of the keys within a first predetermined time interval having a range between upper and lower limits; and wherein each output code generated by the controller corresponds to a set of predetermined control, alphabetic or numeric characters.

2. The data entry system as in claim 1, comprising eight keys within binary sequence coding.

3. The data entry system as in claim 2, wherein the value keys comprise right hand finger values as follows:
right index finger-1;
right middle finger-2;
right ring finger-4; and
right little finger-8.

4. The data entry system as in claim 2, wherein the indexing level keys comprise left hand finger values as follows:
left index finger-16;
left middle finger-32;
left ring finger-64; and
left little finger-128.

5. The data entry system as in claim 1, comprising ten keys within binary sequence coding.

6. The data entry system as in claim 5, wherein the value keys comprise right hand values as follows:
right thumb-1
right index finger-2;
right middle finger-4;
right ring finger-8; and
right little finger-16.

7. The data entry system as in claim 5, wherein the indexing level keys comprise left hand values as follows:
left thumb-32
left index finger-64;
left middle finger-128;
left ring finger-256; and
left little finger-512.

8. The data entry system as in claim 1, wherein each key is associated with a switch and each switch is associated with a register of the controller.

9. The data entry system as in claim 8, wherein any switch closed within a second predetermined time interval sets the associated register to a 1 state and any switch left open within the predetermined time interval leaves its associated register at a 0 state.

10. The data entry system as in claim 9, wherein the second predetermined time interval is scalable between the upper limit of the first time interval and 200 milliseconds.

11. The data entry system as in claim 1, wherein the first predetermined time interval is scalable between 50 milliseconds and 100 milliseconds.

12. The data entry system as in claim 1, wherein the controller is a microprocessor.

13. The data entry system as in claim 2, wherein the system is sized to fit as the back portion of a handheld electronic device.

14. The data entry system as in claim 1, wherein the system further comprises a portable key pad capable of data input while resting on a surface or being held by the user.

15. A keyboard sized to be adapted to the back of a handheld electronic device, the keyboard comprising:

eight keys within binary sequence coding;

wherein four value keys are operated by one hand of a user and four indexing level keys operated by the user's other hand;

each of the keys capable of being depressed and released;

each of the value keys generating a distinct value code upon depression;

each of the indexing level keys generating a distinct indexing code upon depression;

wherein the sum of each of the value codes and each of the indexing codes is distinct from each such other sum and from each of the value codes and each of the indexing codes;

a microprocessor in electrical communication with the keys;

wherein the microprocessor generates output codes depending upon which value codes and indexing codes are generated by the depression of the keys within a first predetermined time interval having a range between upper and lower limits;

wherein each key is associated with a switch and each switch is associated with a register of the microprocessor;

wherein any switch closed within a second predetermined time interval sets the associated register to a 1 state and any switch left open within the predetermined time interval leaves its associated register at a 0 state; and wherein each output code generated by the microprocessor corresponds to a set of predetermined control, alphabetic or numeric characters which are provided as input data to the hand-held device.

16. A separate keyboard adapted to communicate with an electronic device, the keyboard comprising:

at least eight keys within binary sequence coding;

wherein at least four value keys are operated by one hand of a user and at least four indexing level keys operated by the user's other hand;

each of the keys capable of being depressed and released;

each of the value keys generating a distinct value code upon depression;

each of the indexing level keys generating a distinct indexing code upon depression;

wherein the sum of each of the value codes and each of the indexing codes is distinct from each such other sum and from each of the value codes and each of the indexing codes;

a microprocessor in electrical communication with the keys;

wherein the microprocessor generates output codes depending upon which value codes and indexing codes are generated by the depression of the keys within a first predetermined time interval having a range between upper and lower limits;

wherein each key is associated with a switch and each switch is associated with a register of the microprocessor;

wherein any switch closed within a second predetermined time interval sets the associated register to a 1 state and any switch left open within the predetermined time interval leaves its associated register at a 0 state; and wherein each output code generated by the microprocessor corresponds to a set of predetermined control, alphabetic or numeric characters which are provided as input data to the hand-held device.

* * * * *